United States Patent
Xu et al.

(10) Patent No.: US 8,680,749 B2
(45) Date of Patent: Mar. 25, 2014

(54) PIEZOELECTRIC MULTILAYER-STACKED HYBRID ACTUATION/TRANSDUCTION SYSTEM

(75) Inventors: Tian-Bing Xu, Hampton, VA (US); Xiaoning Jiang, State College, PA (US); Ji Su, Yorktown, VA (US)

(73) Assignees: National Institute of Aerospace Associates, Hampton, VA (US); The United States of America as represented by the Administration of NASA, Washington, DC (US)

( * ) Notice: Subject to any disclaimer, the term of this patent is extended or adjusted under 35 U.S.C. 154(b) by 165 days.

(21) Appl. No.: 12/584,290

(22) Filed: Sep. 3, 2009

(65) Prior Publication Data
US 2010/0096949 A1   Apr. 22, 2010

Related U.S. Application Data

(60) Provisional application No. 61/093,767, filed on Sep. 3, 2008.

(51) Int. Cl.
*H01L 41/113* (2006.01)

(52) U.S. Cl.
USPC .......................................... 310/339; 310/328

(58) Field of Classification Search
USPC .......................................... 310/328, 337, 339
See application file for complete search history.

(56) References Cited

U.S. PATENT DOCUMENTS

| 4,999,819 | A  |   | 3/1991  | Newnham et al. |
| 5,276,657 | A  |   | 1/1994  | Newnham et al. |
| 5,632,841 | A  |   | 5/1997  | Hellbaum et al. |
| 5,639,850 | A  |   | 6/1997  | Bryant |
| 6,066,911 | A  | * | 5/2000  | Lindemann et al. ..... 310/323.02 |
| 6,071,088 | A  | * | 6/2000  | Bishop et al. .................. 417/322 |
| 6,614,143 | B2 | * | 9/2003  | Zhang et al. .................. 310/317 |
| 7,394,181 | B2 |   | 7/2008  | Su et al. |
| 7,446,459 | B2 |   | 11/2008 | Xu et al. |
| 2006/0197405 | A1 | * | 9/2006 | Su et al. ......................... 310/311 |
| 2008/0074000 | A1 | * | 3/2008 | Bennett et al. ................ 310/328 |
| 2008/0238260 | A1 | * | 10/2008 | Xu et al. ....................... 310/339 |

FOREIGN PATENT DOCUMENTS

JP          62-228111 A   * 10/1987 ............ G01C 19/56

* cited by examiner

*Primary Examiner* — Thomas Dougherty
(74) *Attorney, Agent, or Firm* — Kimberly A. Chasteen; Robin W. Edwards

(57) ABSTRACT

A novel full piezoelectric multilayer stacked hybrid actuation/transduction system. The system demonstrates significantly-enhanced electromechanical performance by utilizing the cooperative contributions of the electromechanical responses of multilayer stacked negative and positive strain components. Both experimental and theoretical studies indicate that for this system, the displacement is over three times that of a same-sized conventional flextensional actuator/transducer. The system consists of at least 2 layers which include electromechanically active components. The layers are arranged such that when electric power is applied, one layer contracts in a transverse direction while the second layer expands in a transverse direction which is perpendicular to the transverse direction of the first layer. An alternate embodiment includes a third layer. In this embodiment, the outer two layers contract in parallel transverse directions while the middle layer expands in a transverse direction which is perpendicular to the transverse direction of the outer layers.

18 Claims, 16 Drawing Sheets

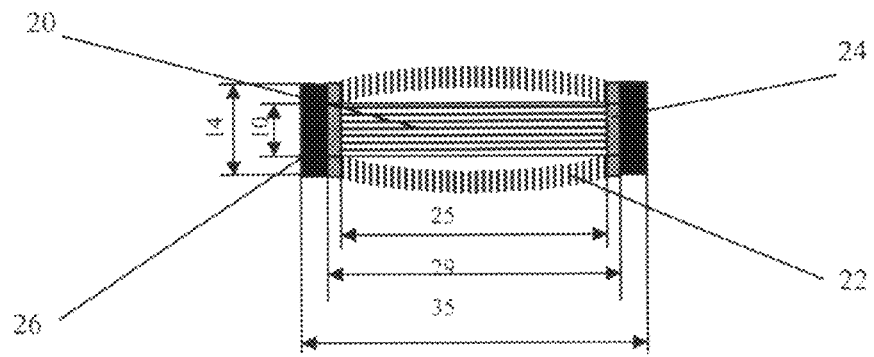
FIG 6A
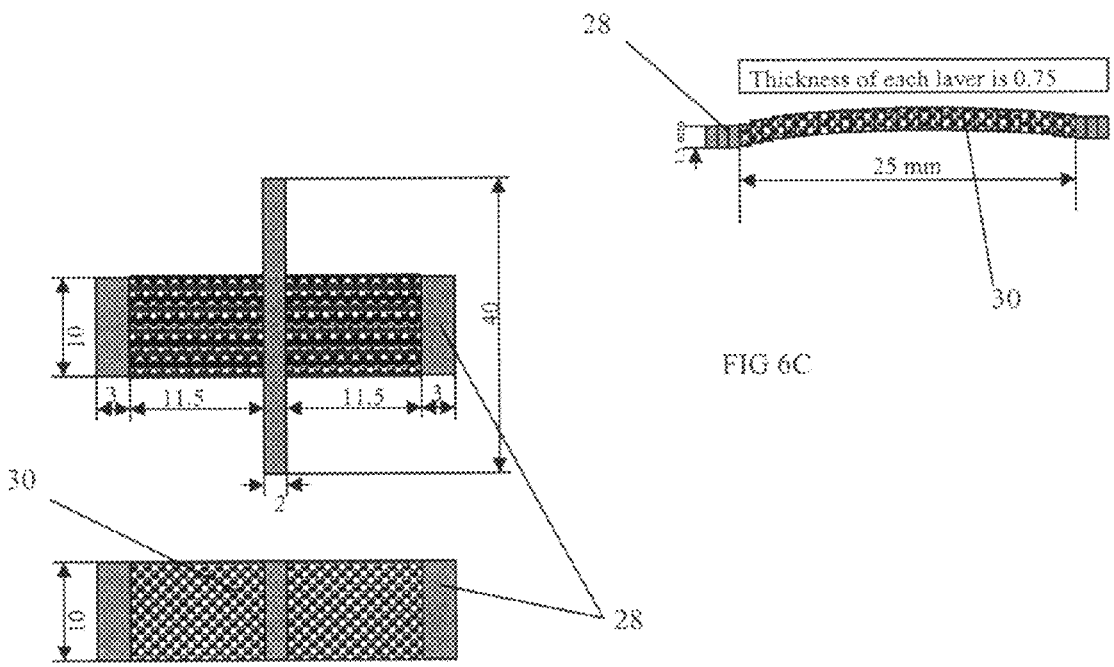
FIG 6C
FIG 6B

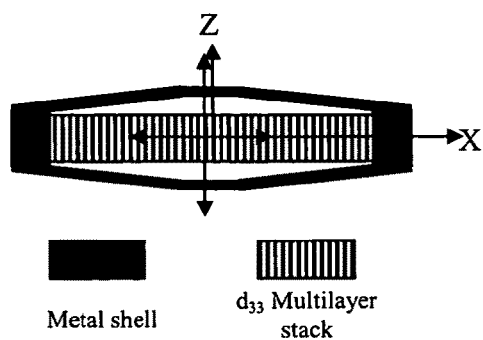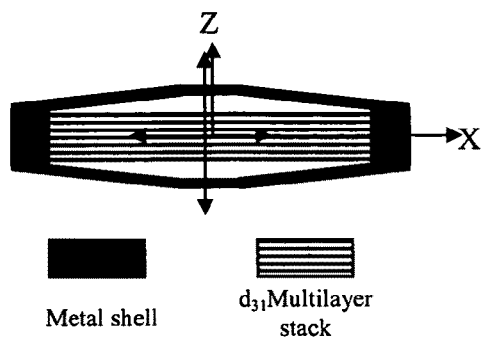
FIG 16A
FIG 16B

PIEZOELECTRIC MULTILAYER-STACKED HYBRID ACTUATION/TRANSDUCTION SYSTEM

CROSS REFERENCE TO RELATED APPLICATION

The present application claims priority from U.S. Provisional Application Ser. No. 61/093,767, filed Sep. 3, 2008.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Cooperative Agreement No. NCC-1-02043 awarded by the National Aeronautics and Space Administration.

BACKGROUND OF THE INVENTION

1. Field of the Invention

The present invention relates to high performance electromechanical actuators, and, more particularly to a piezoelectric actuation/transduction system.

2. Description of Related Art

Many civilian and military applications require high performance electromechanical actuators. These include active vibration control, dynamic flow control in aerospace, underwater navigation and surveillance, and microphones, etc. High displacement and electromechanical output power are two main demands for actuators needed in many applications. In the past few decades, a great deal of effort has been devoted to two research fields: 1) the development of electromechanically active materials offering the desired properties and 2) the development of electromechanical devices which utilize the materials in an efficient manner. Since metal-ceramic composite actuators were invented (the so called Moonies), many device configurations have been exploited for amplified displacement and enhanced efficiency.

Recently, a hybrid actuation system (HYBAS) was developed to utilize the characteristics of the electromechanical performance of these two types of electroactive materials in a cooperative and effective way. This system is described in issued U.S. Pat. No. 7,394,181, July 2008 "Hybrid Electromechanical Actuator and Actuation System," incorporated herein by reference. The system showed significantly-enhanced electromechanical performance compared to the performance of devices made of each constituent material individually. A theoretical model for the HYBAS was also developed, considering the elastic and electromechanical properties of the materials utilized in the system and the device configuration. A comparison was made with experimental data which showed that the model predicts the response of the HYBAS with good accuracy. More recently, new synthetic jet actuator concepts were invented copending patent application Ser. Nos. 60/842,458, 60/842,459, and 60/842,686), piezoelectric hybrid energy harvesting transducer (HYBERT) (issued U.S. Pat. No. 7,446,459, November 2008), incorporated herein by reference, and piezoelectric triple hybrid actuation system (TriHYBAS) based on the understanding of the electromechanical properties of piezoelectric materials and their applications.

In order to enhance the mechanical energy output to obtain high displacement, large mechanical load capability (high blocking force) with low applied voltage for a HYBAS, a full piezoelectric multilayer stacked hybrid actuation/transduction system (Stacked-HYBATS) was desired.

A novel full piezoelectric multilayer stacked hybrid actuation/transduction system has been developed. The system demonstrates significantly-enhanced electromechanical performance by utilizing the cooperative contributions of the electromechanical responses of multilayer stacked negative and positive strain components. Both experimental and theoretical studies indicate that, for this system, the displacement is over three times that of a same-sized conventional flextensional actuator/transducer. The coupled resonance mode between positive and negative strain components of the system is much stronger than the resonance of a single element actuation only when the effective lengths of the two kinds of elements match. Compared with a prior hybrid actuation system, the multilayer system is designed to provide high mechanical load capability, low voltage driving, and a high effective piezoelectric constant. The present system provides extremely high effective piezoelectric constants both at resonance and off-resonance frequencies. The effective piezoelectric constant can be altered by varying the size of each component: the degree of the pre-curvature of the positive strain components, the thickness of each layer in the multilayer stacks, and the piezoelectric constant of the material used. Since all the elements are piezoelectric components, the system can serve as projector and receiver for underwater detection. The performance of the system can be enhanced by improving the piezoelectric properties. With the present system, future actuator/transducer designs and piezoelectric material applications will reach a new level. The experimental results indicate that the stacked hybrid actuation/transduction system can provide displacement over three times larger than a same-sized conventional flextensional actuator/transducer with compatible mechanical load capability. Moreover, the coupled resonance between positive strain and negative strain components of a stacked hybrid actuation/transduction system is much stronger than the resonance peak of a single element actuation when the effective lengths of the two kinds of elements match each other.

An object of the present invention is to provide a piezoelectric multilayer stacked hybrid actuation/transduction system.

An object of the present invention is to provide a piezoelectric multilayer stacked hybrid actuation/transduction system which provides increased displacement over similar sized flextensional actuator/transducers with the same level of mechanical load capability.

Another object of the present invention is to provide a piezoelectric multilayer stacked hybrid actuation/transduction system which includes positive and negative strain components.

Yet another object of the present invention is to provide a piezoelectric multilayer stacked hybrid actuation/transduction system which provides an extremely high effective piezoelectric constant at resonance frequency and off-resonance frequencies.

Finally, it is an object of the present invention to accomplish the foregoing objectives in a simple and cost effective manner.

SUMMARY OF THE INVENTION

The present invention addresses these needs by providing an electromechanical actuator which includes at least two electromechanical elements. Both electromechanical elements include an electromechanically active component which contracts in a lengthwise direction when electric power is applied thereto; however, the electromechanical elements are disposed in relation to one another such that said lengthwise directions thereof are parallel to one another, and they are mechanically coupled to one another at least at two opposing edges thereof An electric power source is coupled to the electromechanically active components for simultaneously applying electric power thereto. The electromechanically active components include at least one layer of an electroactive polymer, preferably a piezoelectric polymer or an electrostrictive polymer. Alternatively, the electromechanically active components include at least one layer of an electroactive ceramic. In a particularly preferred embodiment, the actuator further includes a third electromechanical element which includes an electromechanically active component that expands in a lengthwise direction when electric power is applied thereto. The third electromechanical element is disposed in relation to the first electromechanical element such that said lengthwise direction thereof is parallel to the lengthwise direction of the first electromechanical element, and is mechanically coupled to said first and second electromechanical elements at least at two opposing edges thereof In this embodiment, the first electromechanical element is sandwiched between said second and third electromechanical elements. The electric power source is coupled to all three electromechanically active components for the simultaneously application of electric power to each of the electromechanically active components. As with the first two electromechanically active components, the third electromechanically active component includes at least one layer of an electroactive polymer, preferably a piezoelectric polymer or an electrostrictive polymer. Alternatively, the electromechanically active component includes at least one layer of an electroactive ceramic.

BRIEF DESCRIPTION OF THE DRAWINGS

A more complete description of the subject matter of the present invention and the advantages thereof, can be achieved by the reference to the following detailed description by which reference is made to the accompanying drawings in which:

FIG. 6A shows a diagram of an exemplary piezoelectric ceramic hybrid actuation system;

FIG. 6B shows a diagram of the multilayer stack based negative strain component of a piezoelectric ceramic hybrid actuation system;

FIG. 6C shows a diagram of the multilayer stack based positive strain component of a piezoelectric ceramic hybrid actuation system;

FIG. 16A shows a diagram of multilayer stack-based flextensional actuator, inorganic $d_{33}$ mode; and FIG. 16B shows a diagram of multilayer stack-based flextensional actuator, inorganic $d_{31}$ mode.

Figure 1A:
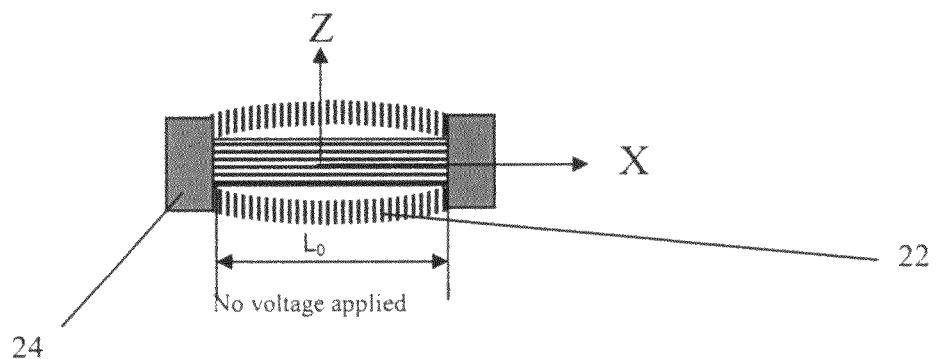
FIG. 1A shows a diagram of a full piezoelectric multilayer stacked hybrid actuation/transduction system according to the preferred embodiment of the present invention when no voltage is applied to all the active elements.

ELEMENT LIST 20 negative strain component
22 positive strain component
24 ceramic
26 steel
28 passive ceramic
30 piezoelectric ceramic

DETAILED DESCRIPTION OF THE PREFERRED EMBODIMENT

The following detailed description is of the best presently contemplated mode of carrying out the invention. This description is not to be taken in a limiting sense, but is made merely for the purpose of illustrating general principles of embodiments of the invention. For example, the actuation system can be designed in various shapes, including but not limited to rectangular, circular, square, and oval.

Figure 1B:
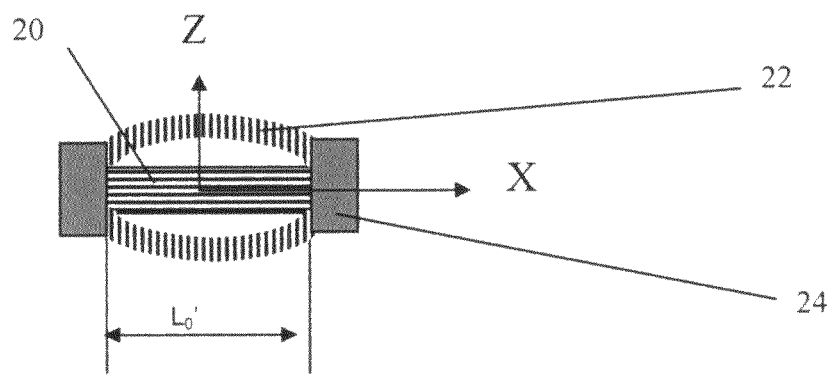
FIG. 1B shows a diagram of a full piezoelectric multilayer stacked hybrid actuation/transduction system according to the preferred embodiment of the present invention when a voltage is applied to all the active elements.
Figure 2A:
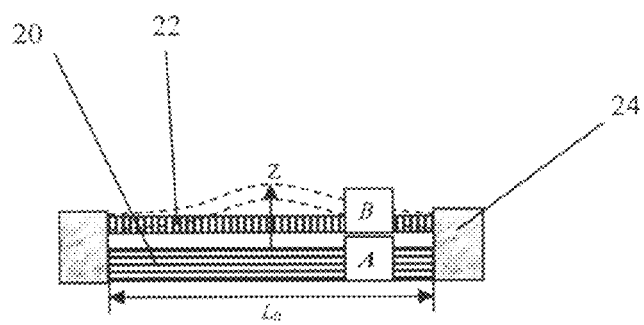
FIG. 2A shows a diagram of a single-sided full piezoelectric multilayer stacked hybrid actuation/transduction system according to the preferred embodiment of the present invention.
Figure 2B:
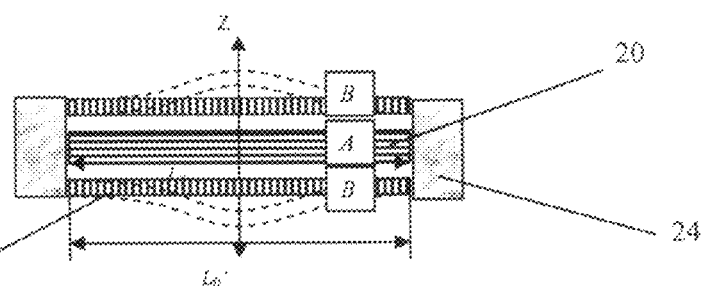
FIG. 2B shows a diagram of a double-sided full piezoelectric multilayer stacked hybrid actuation/transduction system according to the preferred embodiment of the present invention.

An example of a full piezoelectric multilayer stacked hybrid actuation/transduction system is schematically shown in FIG. 1. The negative-strain component 20 contracts and the positive-strain component 22 expands, each along its lengthwise direction, when an electric field is applied on the device as shown in FIG. 1B. The interaction between the two elements enhances motion along the Z axis for a stacked hybrid actuation/transduction system. The difference between the stacked hybrid actuation/transduction system and the HYBAS is that all the elements can be made from one kind of material. The multilayer stacked positive and negative strain components enable the stacked hybrid actuation/transduction system to provide high mechanical load capability, low voltage driving, and high effective piezoelectric constant in one device. A stacked hybrid actuation/transduction system can be a single-sided stacked hybrid actuation/transduction system, such as the one shown in FIG. 2A, or a double-sided stacked hybrid actuation/transduction system, such as the one shown in FIG. 2B, which behaves similarly to a conventional flextensional actuator. In order to dominate the dynamic length of the stacked hybrid actuation/transduction system by the negative strain component, the area of the cross section for the negative strain component will be much larger than the total cross-sectional areas of the two positive strain components.

In general, the transverse strain is negative and longitudinal strain positive in inorganic materials, such as ceramics/single crystals. Different piezoelectric multilayer stack configurations can cause a piezoelectric ceramic/single crystal multilayer stack exhibit negative strain or positive strain, as shown in FIG. 3, at a certain direction without increasing the applied voltage. The stacked hybrid actuation/transduction system utilizes the properties of different strain directions in each single element to enhance the performance of a designed transducer/actuator system for underwater transductions, mechanical motion controls, and other military and civilian applications such as optical scanners for warfare, position controls for intelligent facilities, and flow dynamic controls.

Figure 3A:
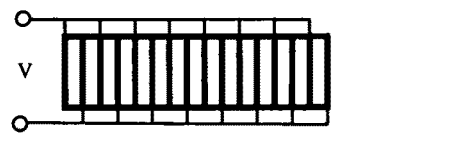
FIG. 3A shows a diagram of piezoelectric inorganic (ceramic or single crystal) positive strain (in X direction) multilayer stack according to the preferred embodiment of the present invention.
Figure 3B:
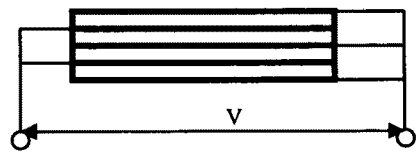
FIG. 3B shows a diagram of piezoelectric inorganic (ceramic or single crystal) negative strain (in X direction) multilayer stack according to the preferred embodiment of the present invention.

The positive strain components can be made from any type of inorganic piezoelectric ceramic materials, such as lead zirconate titanate (PZT), lead magnesium niobate-lead titanate ceramic (1-x)PbMg1/3Nb2/3O3-xPbTiO(3) (PMN-xPT), lead zinc niobate-lead magnesium niobate-lead titanate ceramics [PbZn1/3Nb2/3O3-PbMg1/3Nb2/3O3-PbTiO3 (PZN-PMN-PT)], lead lanthanum zirconate titanate (PLZT); and piezoelectric single crystal materials, such as, lead magnesium niobate-lead titanate (PMN-PT) single crystal, lead zinc niobate-lead titanate (PZN-PT)single crystal, and barium titanate ($BaTiO_3$) single crystal can be used for piezoelectric positive strain component. In order to achieve positive strain in the length direction of the multilayer stack, the stack must be configured as shown in FIG. 3a. However, for organic piezoelectric materials, such as piezoelectric poly (vinylidene fluoride) (PVDF) polymer, and piezoelectric poly (vinylidene fluoride-trifluoroethylene) (PVDF-TrFE) copolymers the multilayer configuration will be different. It has to be configurated as shown in FIG. 3b to achieve positive strain in the length direction of the multilayer stack.

The negative strain component is preferably made as follows. The art of the invention is to optimize performance using the configuration of the piezoelectric positive and negative strain components. The negative strain component can be made utilizing the same piezoelectric materials as described for the positive strain component above. The difference lies in the configuration of the multilayer components in opposite style. For inorganic piezoelectric material (ceramics/single crystals) multilayer, it must be configured as shown in FIG. 3b to achieve the negative strain along its length. However, for organic piezoelectric polymer multilayer, it must be configured as shown in FIG. 3a to obtain negative strain along its length.

Figure 4A:
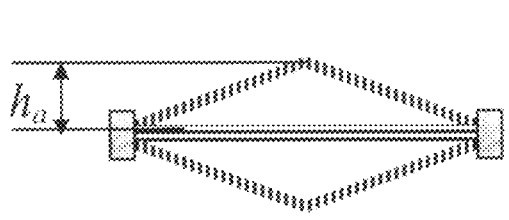
FIG. 4A shows a diagram of a configuration of a full piezoelectric multilayer stacked hybrid actuation/transduction system wherein the two positive strain components are a triangular shape under uniform loads.
Figure 4B:
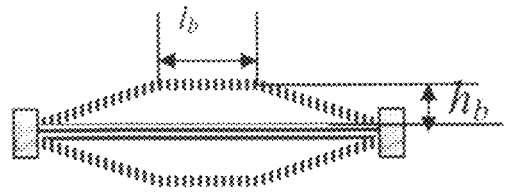
FIG. 4B shows a diagram of a configuration of a full piezoelectric multilayer stacked hybrid actuation/transduction system wherein the two positive strain components are conventional flextensional actuator metal shell shape under uniform loads.
Figure 4C:
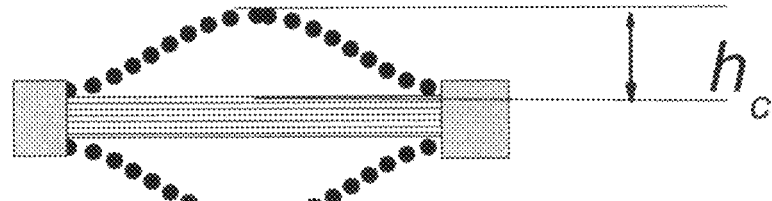
FIG. 4C shows a diagram of a configuration of a full piezoelectric multilayer stacked hybrid actuation/transduction system wherein the two positive strain components are deformations under uniform loads.

In order to control the deformation direction of the positive strain components in a stacked hybrid actuation/transduction system, we needed to analyze the three different pre-curvature positive components as shown in FIG. 4. These three are typical positive strain components styles in this invention.

The dimensions of the major components are listed in Table 1. For this particular example, assume the active length of the stacked hybrid actuation/transduction system is 25 mm long and the integrated lengths of the positive strain components are 25.25 mm (1% longer than the negative strain components).

If a piezoelectric ceramic is selected, the typical maximum strain for positive strain component is 0.2%, and the negative strain component is 0.1%. The displacement for various situations for each stacked hybrid actuation/transduction system is listed in Table 2.

TABLE 1

The dimensions of the major components of stacked hybrid actuation/transduction system

| Component | Dimension |
| --- | --- |
| Effective length of stacked hybrid actuation/transduction system | 25 mm |
| Negative strain components | 25 mm |
| Integrated lengths of positive component | 25.25 mm |
| $l_b$ | 6 mm |
| $h_a$ | 1.77125 mm |
| $h_b$ | 1.6014 mm |
| $h_c$ | 1.60625 mm |

TABLE 2

Displacement for various situations for each stacked hybrid actuation/transduction system

| HYBAS | Positive component actuation only (μm) | Negative component actuation only (μm) | HYBAS actuation (μm) |
|---|---|---|---|
| A-Type (FIG. 4a) | 340.25 | 172 | 498 |
| B-Type (FIG. 4b) | 286.5 | 144.75 | 417.5 |
| C-Type (FIG. 4c) | 309.25 | 156.25 | 465 |

The displacement data indicate that the stacked hybrid actuation/transduction system with triangular shape positive components (A-Type, FIG. 4a) has maximum displacements, the stacked hybrid actuation/transduction system with conventional flextensional shape positive component (B-Type, FIG. 4B) has minimum displacements, and the stacked hybrid actuation/transduction system with the curvature of deformations under uniform loads (C-Type, FIG. 4C) has mid-level displacements. However, stacked hybrid actuation/transduction system A-Type (FIG. 4A) and B-Type (FIG. 4B) will have stress accumulations at a certain area, and the stacked hybrid actuation/transduction system C-Type (FIG. 4C) has uniform stress distribution. Overall, stacked hybrid actuation/transduction system C-Type (FIG. 4C) is one of the best choices for pre-curvature positive strain components for most applications. However, A-type and B-type stacked hybrid actuation/transduction system also have some advantages for some specific applications. For the first experimental validation for the stacked hybrid actuation/transduction system, the C-type configuration was selected in this invention.

Piezoelectric ceramic is selected as an example of an electroactive material which is acceptable for the stacked hybrid actuation/transduction system. The modeled displacements for a 25 mm long stacked hybrid actuation/transduction system with different degrees of curvature are listed in Table 3. When the pre-curvature is increased, the displacement of the stacked hybrid actuation/transduction system will decrease. Considering the process of a stacked hybrid actuation/transduction system and the stress release in the multilayer stack and other applications, the optimized integrated length of pre-curved positive strain component is at the range of 100.1% to 100.25% of the length of the stacked hybrid actuation/transduction system.

TABLE 3

The modeled displacements for a 25 mm long stacked hybrid actuation/transduction system with different degrees of curvature

| Integrated length of pre-curved positive strain components in a 25 mm long stacked hybrid actuation/transduction system | $h_c$ (μm) | Displacement of stacked hybrid actuation/transduction system (μm) |
|---|---|---|
| 25.25 mm (1%) | 1606.25 | 465 |
| 25.125 mm (0.5%) | 1133.75 | 476.25 |
| 25.075 mm (0.25%) | 801.25 | 775 |
| 22.025 mm (0.1%) | 507.5 | 1005 |

Figure 5:
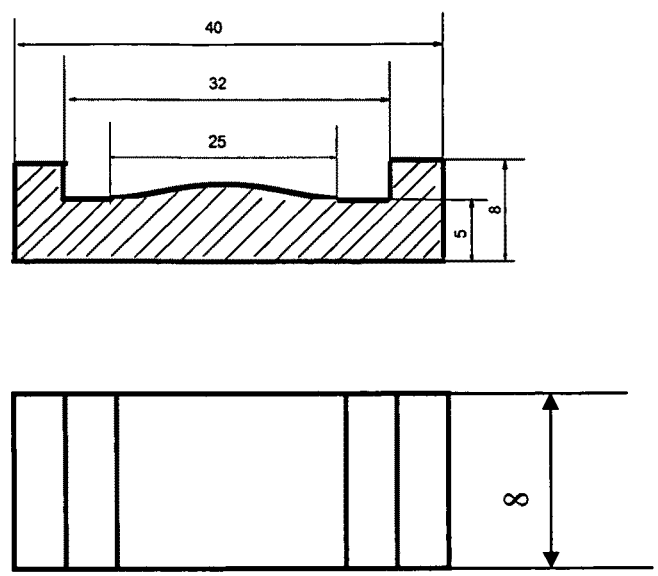
FIG. 5 shows an exemplary mode for multilayer stack processing according to the preferred embodiment of the present invention for positive strain components.

According to the theoretical modeling, the mode for the multilayer processing is designed as shown in FIG. 5.

Equation for the curvature ("0" position at the center)

$$z = \frac{1}{18600}\left(\left(\frac{L_0}{2}\right)^2 - (x)^2\right)^2$$

Where z: displacement, $L_0$: length of curvature, and x is the location along x axis A diagram of the designed stacked hybrid actuation/transduction system is shown in FIG. 6. In order to control the length of the stacked hybrid actuation/transduction system by the negative strain component, the overall dimension of the cross-section of the negative strain component is more than three times higher than the overall dimension of the positive strain components, and the positive strain component is pre-curved.

In order to fabricate a pre-curved positive strain component, a pair of male and female modes are designed and shown in FIG. 5.

Piezoelectric ceramic stacks were used for the first concept study. Piezoelectric single crystal stacks are preferably used for the future real applications of high performance stacked hybrid actuation/transduction system to increase the displacement of a stacked hybrid actuation/transduction system.

Figure 7A:
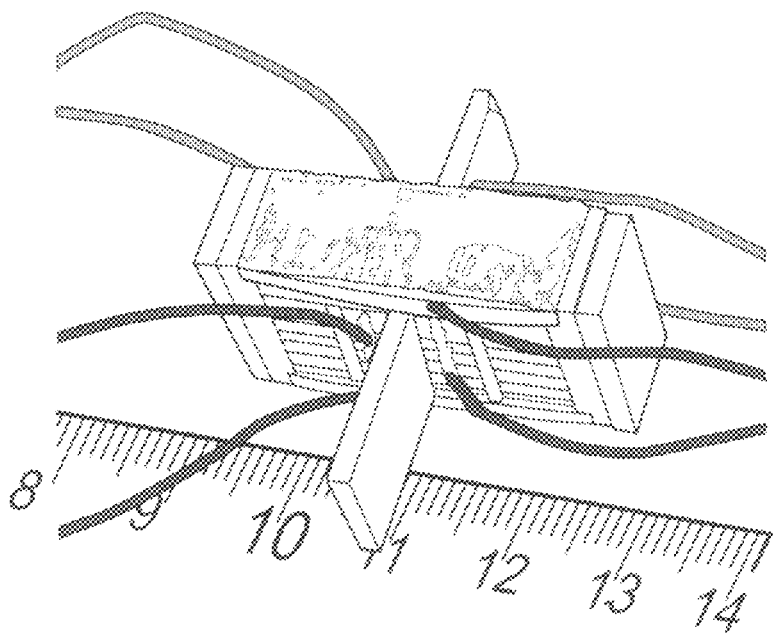
FIG. 7A shows a top view of a full piezoelectric multilayer stacked hybrid actuation/transduction system according to the preferred embodiment of the present invention.

A picture of the fabricated stacked hybrid actuation/transduction system according to the present invention is shown in FIG. 7.

The parameters of the full piezoelectric ceramic stacked hybrid actuation/transduction system are listed in table 4.

TABLE 4

The parameters of the full piezoelectric ceramic stacked hybrid actuation/transduction system

| | | Parameters | | | | | | |
|---|---|---|---|---|---|---|---|---|
| | | Length (mm) | | | Thickness (mm) | | Width (mm) | |
| | | | Single | | | Single | | |
| Materials | | Total | layer | Effective | total | layer | Total | Effective |
| Negative strain piezoelectric ceramic multilayer stack | Designed | 25.0 | | 23.0 | 10 | 1.0 | 10.0 | 10.0 |
| | Fabricated | 25.0 | | 23.0 | 10 | 1.0 | | |
| Positive strain piezoelectric composites (each side) | Designed | 31.0 | 0.625 | 25.0 | 1.0 | 1.0 | 10.0 | 10.0 |
| | Fabricated | 31.0 | 0.65 | 27.5 | 1.0 | 1.0 | 10.0 | 10.0 |

Figure 8:
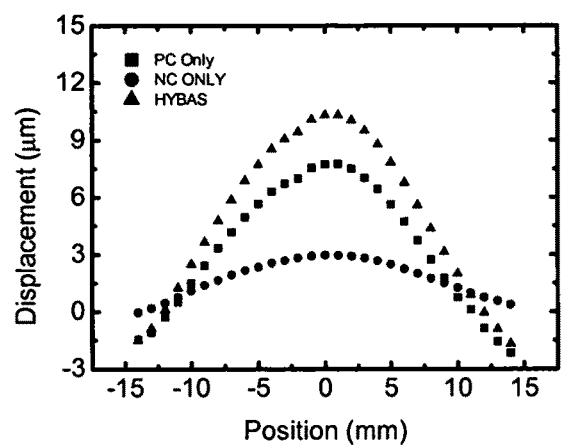
FIG. 8 shows a graph of the displacement profiles of a full ceramic multilayer single-sided stacked hybrid actuation/transduction system according to the preferred embodiment of the present invention at different working modes at 150 V DC bias and 1 Hz 100 $V_{rms}$ AC.

The measured displacement profiles of the full ceramic single-sided stacked hybrid actuation/transduction system at different working modes at 150 V DC bias and 1 Hz 100 $V_{rms}$ AC are shown in FIG. 8. The experimental results indicate that the displacement of stacked hybrid actuation/transduction system is greater than that of a single element actuation. When a voltage is applied to the positive strain component (for the cases of positive strain element active only or the positive and negative component active simultaneously), the displacement goes down to under zero at the two ends of the stacked hybrid actuation/transduction system, i.e., the displacement direction is opposite with the applied electric field. This may be due to negative strain of the positive strain components perpendicular to their lengthwise directions. When a positive voltage is applied to the positive strain component, the piezoelectric component will shrink perpendicularly to the electric field direction.

Figure 9:
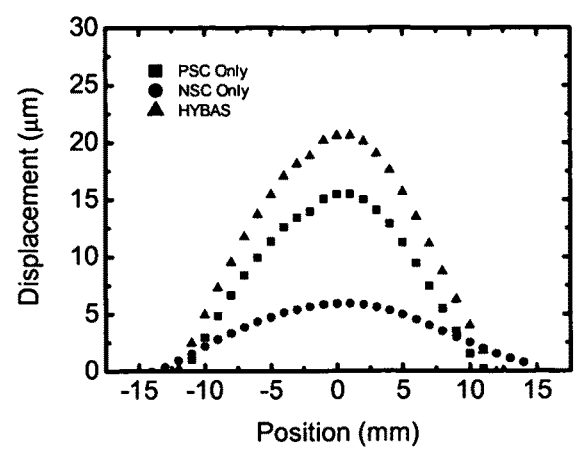
FIG. 9 shows a graph of the displacement profiles of a full ceramic multilayer double-sided stacked hybrid actuation/transduction system according to the preferred embodiment of the present invention at different working mode at 150 V DC bias and 1 Hz 100 $V_{rms}$ AC

The measured displacement profiles of the double-sided stacked hybrid actuation/transduction system at different working modes at 150 V DC bias and 1 Hz 100 $V_{rms}$ AC are shown in FIG. 9. The experimental results indicate that the displacement of the stacked hybrid actuation/transduction system is always better than a single element actuation only. For the situation that the negative strain component active only is equivalent to a same sized flextensional actuator/transducer. Compared to a conventional flextensional actuator (only a negative strain component is active) the performance of a full ceramic multilayer double-sided stacked hybrid actuation/transduction system is much better than a conventional flextensional actuator.

Figure 10:
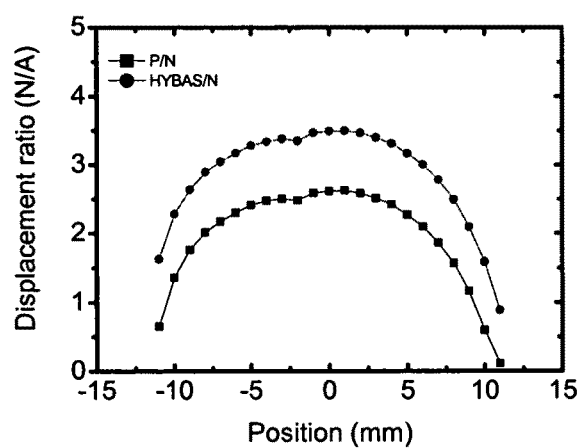
FIG. 10 shows a graph of the displacement ratio of positive strain component of stacked hybrid actuation/transduction system over the negative strain component in a double-sided stacked hybrid actuation/transduction system at 150 V DC bias and 1 Hz 100 $V_{rms}$ AC signal.

The displacement for the positive strain components active only or the stacked hybrid actuation/transduction system (Positive strain component+Negative strain component) active over the displacement of the negative strain component active only is shown in FIG. 10. The positive strain components produced displacement 2.6 times that of the negative strain active only at the center of the stacked hybrid actuation/transduction system. This is due to the following reasons:

(a) The thickness ratio of each layer of the negative strain component over each layer of the positive strain component is 1.6. The electric field of the positive strain component is 1.6 time higher than the electric field of the negative strain component when the same voltage is applied to each element of the stacked hybrid actuation/transduction system.

(b) The piezoelectric constant of the positive strain component is two times of the negative strain component.

(c) The effective length of the positive strain component is 1.08 times that of the negative strain component. Therefore, the deformation of the positive strain component is larger than the deformation of the negative strain component when the same voltage is applied to the two kinds of components. The stacked hybrid actuation/transduction system produces displacement which is 3.5 times that of the negative strain component active only at the center of the stacked hybrid actuation/transduction system.

Figure 11:
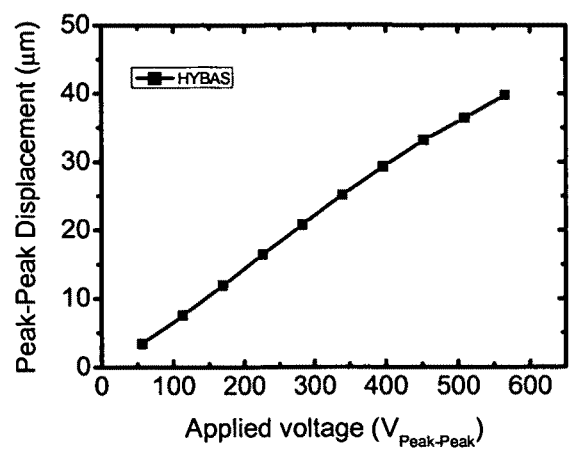
FIG. 11 shows a graph of the displacement as a function of applied voltage for stacked hybrid actuation/transduction system, (note 1 $V_{rms}=2\times2^{0.5}$ $v_{peak-peak}$)

The displacement as a function of applied voltage for the stacked hybrid actuation/transduction system is shown in FIG. 11. The displacement increases generally constantly with the applied voltage. This indicates that the displacement of the stacked hybrid actuation/transduction system increases linearly with the applied electric field increase.

Figure 12:
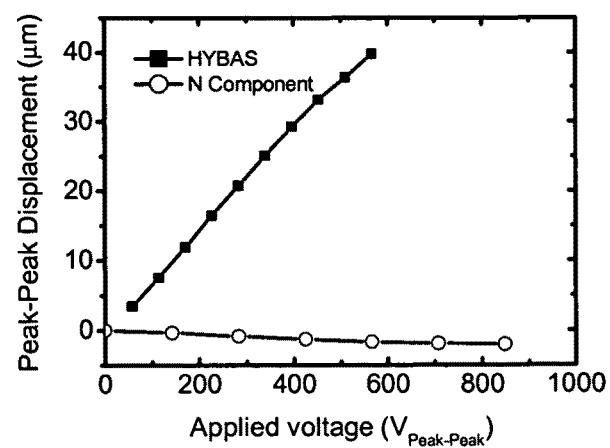
FIG. 12 shows a graph of a comparison of displacements as a function of applied voltage for the stacked hybrid actuation/transduction system and the negative component in the direction of its length, (note 1 $V_{rms}=2\times2^{0.5}$ $v_{peak-peak}$)

The comparison of the peak-to-peak displacements as a function of applied peak-to-peak voltage for the stacked hybrid actuation/transduction system and the negative component along its length is presented in FIG. 12. The results indicate that the ratio of the displacement for a stacked hybrid actuation/transduction system at the center over its negative component in the length direction is −25 times. The ratio can be varied by alternating the degree of the pre-curvature of the positive strain components of the stacked hybrid actuation/transduction system, and the thickness of the layers in the multilayer stacks. It is possible to make the ratio over 100 times by a proper design.

Figure 13:
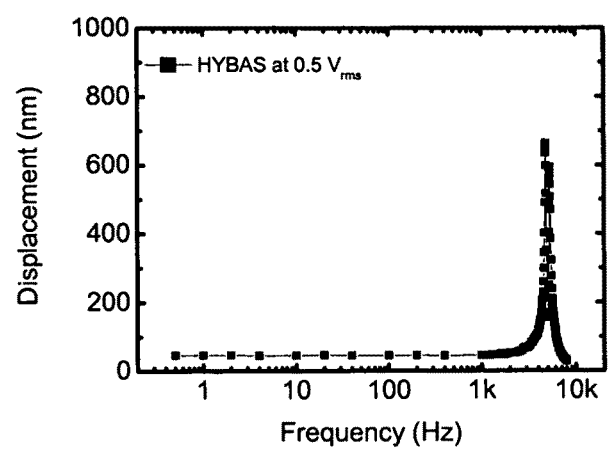
FIG. 13 shows a graph of the displacement as a function of frequency for the stacked hybrid actuation/transduction system at 0.5 $V_{mrs}$.

The displacement as a function of frequency for the stacked hybrid actuation/transduction system at 0.5 $V_{mrs}$ is shown in FIG. 13. A strong resonance peak is observed at the frequency of 4830 Hz. The mechanical Q value for the resonance peak is 16.1. The displacement at the resonance peak is 15 times of the displacement at off resonance peak.

Figure 7B:
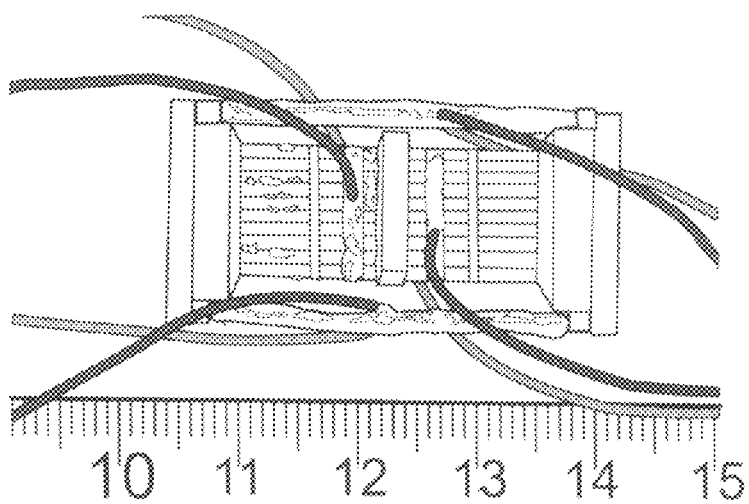
FIG. 7B shows a side view of a full piezoelectric multilayer stacked hybrid actuation/transduction system according to the preferred embodiment of the present invention.
Figure 14A:
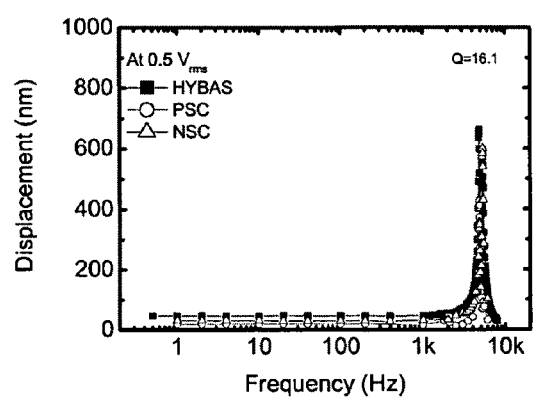
FIG. 14A shows a graph, in log plot, of the displacement as a function of frequency for the stacked hybrid actuation/transduction system, positive strain elements active only, and negative strain element active only at 0.5 $V_{mrs}$.
Figure 14B:
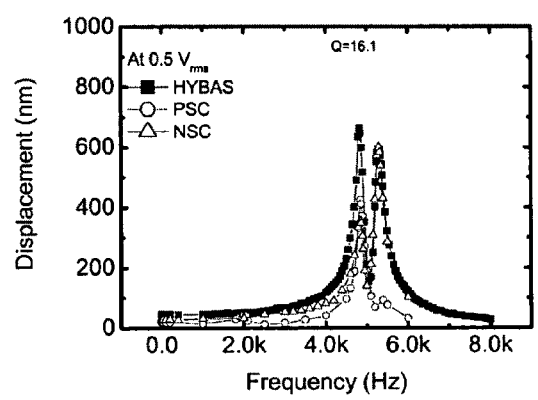
FIG. 14B shows a graph, in linear plot, of the displacement as a function of frequency for the stacked hybrid actuation/transduction system, positive strain elements active only, and negative strain element active only at 0.5 $V_{mrs}$.

A comparison of the displacement as a function of frequency for the stacked hybrid actuation/transduction system, and positive strain component and negative strain component actuation only at 0.5 $V_{mrs}$ is shown in FIG. 14. In FIG. 14A all the elements have strong resonance peaks at several kHz. The displacements at below 1 kHz remain constant. In FIG. 14B, the details of the resonance peaks are observed for the stacked hybrid actuation/transduction system at 0.5 $V_{mrs}$ and each element. One significant resonance peaks at 4850 Hz, for the positive strain element. However, two significant resonance peaks at 4850 Hz and 5300 Hz are observed for the negative strain component active only and the stacked hybrid actuation/transduction system. The ratio of the two resonance frequencies is 1.093. FIG. 7 shows that that the piezoelectric effective length of the positive strain components in the stacked hybrid actuation/transduction system is 27.5 mm instead of the designed 25 mm. The dark color portions are the active piezoelectric components and the brown portions are the passive components in FIG. 7. As shown in FIG. 7, the size difference in length for the positive strain components and the negative strain component is clear, particularly in FIG. 7b. The ratio of the length of the positive strain component over the length of the negative strain component is 1.1. The resonance peak of the negative strain component at 5300 Hz is the nature frequency of the negative component. However, the resonance peak at 4850 Hz is due to the mechanical coupling from the positive strain component. There are also two peaks at 4850 Hz and 5300 Hz for the stacked hybrid actuation/transduction system. This is also due to the size mismatch for the two kinds of components. For the resonance peak at 4850 Hz, the resonance peak shown for the stacked hybrid actuation/transduction system is much stronger than for each element actuation only. If the lengths of the positive and negative strain components match each other, the two resonance peaks will be moved together and the resonance peak will be enhanced. This indicates that the stacked hybrid actuation/transduction system can be a good candidate for underwater detection transducers.

The inventive concept described herein can be used as a transducer. In this embodiment, a first electromechanical element includes a first electromechanically active component that contracts in a lengthwise direction when electric power is applied thereto while a second electromechanical element includes a second electromechanically active component that expands in a lengthwise direction when electric power is applied thereto. These electromechanical elements are disposed in relation to one another such that said lengthwise directions thereof are parallel to one another, and are mechanically coupled to one another at least at two opposing edges thereof. As described above, both of the electromechanically active components are manufactured from the same piezoelectric material. A mechanical deflection means is coupled to at least one of said first and second electromechanically active components such that deflection causes an electrical charge to be produced.

The transducer may further include a third electromechanical element which includes an electromechanically active component that expands in a lengthwise direction when electric power is applied thereto. In this embodiment, the third electromechanical element is disposed in relation to the first electromechanical element such that said lengthwise direction thereof is parallel to the lengthwise direction of the first electromechanical element, and is mechanically coupled to the first and second electromechanical elements at least at two opposing edges thereof wherein the first electromechanical element is sandwiched between the second and third electromechanical elements. The mechanical deflection means may be coupled to at least one of said first, second and third electromechanically active components.

Figure 15A:
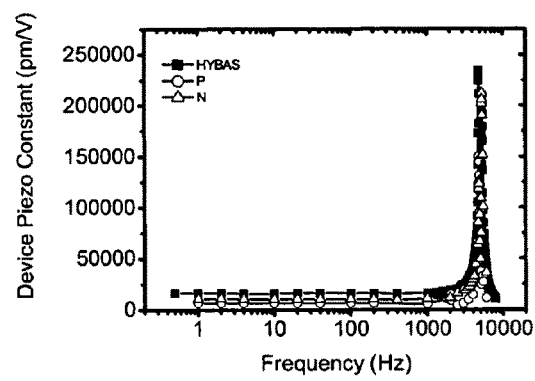
FIG. 15A shows a graph of effective piezoelectric constant as a function of frequency for the stacked hybrid actuation/transduction system, and positive strain elements and negative strain element active only at 0.5 $V_{mrs}$ for full range of frequency plot.
Figure 15B:
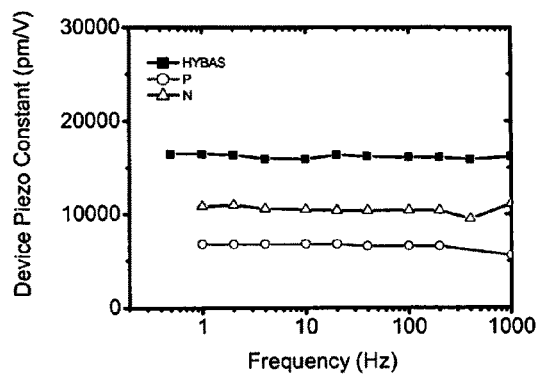
FIG. 15B shows a graph of effective piezoelectric constant as a function of frequency for the stacked hybrid actuation/transduction system, and positive strain elements and negative strain element active only at 0.5 $V_{mrs}$ before resonance frequency plot.

Effective piezoelectric constant is a very important parameter for measuring the sensitivity of a transduction device. The effective piezoelectric constant as a function of frequency for the stacked hybrid actuation/transduction system, and positive strain component and negative strain component actuation only at 0.5 V is shown in FIG. 15. The effective piezoelectric constant for the stacked hybrid actuation/transduction system is 16,500 pC/N at off-resonance frequencies, and 235,720 pC/N at the resonance frequency. The effective piezoelectric constant at resonance frequency will be over 300,000 pC/N if the length of the two kinds of elements matching in the stacked hybrid actuation/transduction system. The effective piezoelectric constant will be about 1,000,000 pC/N if the piezoelectric ceramic ($d_{33}$=750 pC/N, $d_{31}$=-360 pC/N) elements are replaced with piezoelectric PMN-PT single crystal ($d_{33}$=2000 pC/N, $d_{31}$=-1000 pC/N). If the thickness of each layer in the multilayer stack decreases by another 5 times, the effective piezoelectric constant will increase another 5 times. In addition, the effective piezoelectric constant can be improved by reducing the degree of the pre-curvature of the positive strain components in the stacked hybrid actuation/transduction system.

The main purpose of this example is to demonstrate the device concept and the processing possibility for the stacked hybrid actuation/transduction system. For this example, the pre-curved multilayer positive component was made from a ceramic sheet having a thickness of 0.625 mm, the multilayer negative component was made from a ceramic sheet having a thickness of 1 mm and the piezoelectric constants are $d_{33}$=750 pC/N and $d_{31}$=-360 pC/N. The center displacement at 150 V DC bias and 1 Hz 100 $V_{rms}$ AC for the double-sided stacked hybrid actuation/transduction system is over 20 μm. If we made the multilayer positive and negative strain components with the thickness of 0.1 mm PMN-PT single crystal sheet ($d_{33}$=2000 pC/N, and $d_{31}$=-1000 pC/N), the same size double-sided stacked hybrid actuation/transduction system at 150 V DC bias and 100 AC single (equivalent electric field is 14.14 kV/cm, still smaller than the $E_c$=20 kV/cm for piezoelectric single crystal) will produce 400 μm displacement. If the effective length of the double-sided stacked hybrid actuation/transduction system is 60 mm, it will produce over 1 mm displacement. This indicates that the multilayer double-sided stacked hybrid actuation/transduction system technology is available to produce displacement at the range of 1 mm to 2 mm. In addition, the mechanical load capability of the stacked hybrid actuation/transduction system may be easily controlled by alternating the thickness of the multilayer components.

Today's highest performance flextensional actuators are multilayer piezoelectric materials stack based flextensional actuators. They are either working on $d_{31}$ mode or $d_{33}$ mode as shown in FIG. 16. If the thicknesses of each layer in the stacks are the same and the size of each layer is the same, the displacement of the $d_{33}$ mode is two times that of the $d_{31}$ mode. Comparing the stacked hybrid actuation/transduction system with multilayer piezoelectric materials stack based flextensional actuators, the displacement of a stacked hybrid actuation/transduction system will be 3 times the displacement of the same sized $d_{31}$ mode multilayer piezoelectric materials stack based flextensional actuator, and 1.5 times the displacement of the same sized $d_{33}$ mode multilayer piezoelectric materials stack based flextensional actuators.

In summary, a stacked hybrid actuation/transduction system was invented and successfully fabricated. The stacked hybrid actuation/transduction system demonstrates significantly enhanced electromechanical performance by utilizing the advantages of cooperative contributions of the electromechanical responses of multilayer stacked negative and positive strain components. The experimental studies indicate that for a stacked hybrid actuation/transduction system, the displacement is over three times that of a conventional flextensional actuator/transducer of the same size. The coupled resonance between positive and negative strain components of a stacked hybrid actuation/transduction system is much stronger than the resonance of a single element actuation only when the effective lengths of the two kinds of elements match each other. Since all the elements are piezoelectric components, the stacked hybrid actuation/transduction system can serve as projector and receiver for underwater detection. Compared with our previously invented hybrid actuation system (HYBAS), the multilayer stacked hybrid actuation/transduction system can be designed to provide high mechanical load capability, low voltage driving, and a high effective piezoelectric constant. The stacked hybrid actuation/transduction system can provide extremely high effective piezoelectric constant both at resonance frequency and off resonance frequencies. The effective piezoelectric constant can be altered by varying the size of each component, the degree of the pre-curvature of the positive strain components, the thickness of each layer in the multilayer stacks, and the piezoelectric constant of the material used. A high resolution of transducer can be obtained with the stacked hybrid actuation/transduction system structure. The flextensional actuator/transducer could be replaced by a stacked hybrid actuation/transduction system with higher performance. The performance of a stacked hybrid actuation/transduction system can always be enhanced by improving the piezoelectric properties. With the new stacked hybrid actuation/transduction system device concepts, the future actuator designs and piezoelectric material applications will reach a new level.

Obviously, many modifications may be made without departing from the basic spirit of the present invention. Accordingly, it will be appreciated by those skilled in the art that within the scope of the appended claims, the inventions may be practiced other than has been specifically described herein. Many improvements, modifications, and additions will be apparent to the skilled artisan without departing from the spirit and scope of the present invention as described herein and defined in the following claims.

What is claimed is:

1. An electromechanical actuator, comprising:
   a first electromechanical element including a first electromechanically active component that contracts in a lengthwise direction when electric power is applied thereto;
   a second electromechanical element including a second electromechanically active component that expands in a lengthwise direction when electric power is applied thereto, said first and second electromechanical elements being (i) disposed in relation to one another such that said lengthwise directions thereof are parallel to one another, and (ii) mechanically coupled to one another at least at two opposing edges thereof wherein the first and second electromechanically active components are manufactured from the same electromechanically active material; and an electric power source coupled to said first and second electromechanically active components for simultaneously applying electric power thereto.

2. The actuator as set forth in claim 1 wherein said first electromechanically active component and said second electromechanically active component comprise at least one layer of an electroactive polymer.

3. The actuator as set forth in claim 2 wherein said electroactive polymer is selected from the group consisting of piezoelectric polymers and electrostrictive polymers.

4. The actuator as set forth in claim 1 wherein said first electromechanically active component and said second electromechanically active component comprise at least one layer of an electroactive ceramic.

5. The actuator as set forth in claim 1 further comprising a third electromechanical element including a third electromechanically active component that expands in a lengthwise direction when electric power is applied thereto, said third electromechanical element being (i) disposed in relation to said first electromechanical element such that said lengthwise direction thereof is parallel to said lengthwise direction of said first electromechanical element, and (ii) mechanically coupled to said first and second electromechanical elements at least at two opposing edges thereof wherein said first electromechanical element is sandwiched between said second and third electromechanical elements, said electric power source further coupled to said third electromechanically active component for simultaneously applying electric power to said first, second and third electromechanically active components.

6. The actuator as set forth in claim 5 wherein said third electromechanically active component comprises at least one layer of an electroactive polymer.

7. The actuator as set forth in claim 6 wherein said electroactive polymer is selected from the group consisting of piezoelectric polymers and electrostrictive polymers.

8. The actuator as set forth in claim 5 wherein said third electromechanically active component comprises at least one layer of an electroactive ceramic.

9. The actuator as set forth in claim 1 wherein said first electromechanically active component and said second electromechanically active component comprise at least one layer of an electroactive ceramic selected from the group consisting of single crystal ceramics and polycrystal ceramics.

10. An electromechanical transducer, comprising:
a first electromechanical element including a first electromechanically active component that contracts in a lengthwise direction when electric power is applied thereto;
a second electromechanical element including a second electromechanically active component that expands in a lengthwise direction when electric power is applied thereto, said first and second electromechanical elements being
(i) disposed in relation to one another such that said lengthwise directions thereof are parallel to one another, and
(ii) mechanically coupled to one another at least at two opposing edges thereof wherein the first and second electromechanically active components are manufactured from a piezoelectric material, each component being manufactured from the same piezoelectric material; and a mechanical deflection means to deflect at least one of said first and second electromechanically active components such that an electrical charge is produced.

11. The transducer as set forth in claim 10 wherein said first electromechanically active component and said second electromechanically active component comprise at least one layer of a piezoelectric material.

12. The transducer as set forth in claim 11 wherein said piezoelectric material is selected from the group consisting of piezoelectric polymers and piezoelectric ceramics.

13. The transducer as set forth in claim 10 further comprising a third electromechanical element including a third electromechanically active component that expands in a lengthwise direction when electric power is applied thereto, said third electromechanical element being (i) disposed in relation to said first electromechanical element such that said lengthwise direction thereof is parallel to said lengthwise direction of said first electromechanical element, and (ii) mechanically coupled to said first and second electromechanical elements at least at two opposing edges thereof wherein said first electromechanical element is sandwiched between said second and third electromechanical elements, said mechanical deflection means further deflecting at least one of said first, second and third electromechanically active components.

14. The transducer as set forth in claim 13 wherein said third electromechanically active component comprises at least one layer of a piezoelectric material.

15. The transducer as set forth in claim 14 wherein said piezoelectric material is selected from the group consisting of piezoelectric polymers and piezoelectric ceramics.

16. The transducer as set forth in claim 10 wherein said first electromechanically active component and said second electromechanically active component comprise at least one layer of an electroactive ceramic selected from the group consisting of single crystal ceramics and polycrystal ceramics.

17. An electromechanical actuator, comprising:
a first electromechanical element including a first electromechanically active component that contracts in a lengthwise direction when electric power is applied thereto;
a second electromechanical element including a second electromechanically active component that expands in a lengthwise direction when electric power is applied thereto, said first and second electromechanical elements being
(i) disposed in relation to one another such that said lengthwise directions thereof are parallel to one another, and
(ii) mechanically coupled to one another at least at two opposing edges thereof wherein the first and second electromechanically active components are manufactured from the same electromechanically active material;
wherein the first electromechanically active component is configured for negative strain along its lengthwise direction, wherein the second electromechanically active component is configured for positive strain along its lengthwise direction, and wherein an electric power source is coupled to said first and second electromechanically active components for simultaneously applying electric power thereto.

18. The actuator as set forth in claim 17 further comprising a third electromechanical element including a third electromechanically active component that expands in a lengthwise direction when electric power is applied thereto, said third electromechanical element being (i) disposed in relation to said first electromechanical element such that said lengthwise direction thereof is parallel to said lengthwise direction of said first electromechanical element, (ii) mechanically coupled to said first and second electromechanical elements at least at two opposing edges thereof wherein said first electromechanical element is sandwiched between said second and third electromechanical elements, wherein the third electromechanically active component is configured for positive strain along its lengthwise direction, said electric power source further coupled to said third electromechanically active component for simultaneously applying electric power to said first, second and third electromechanically active components.

* * * * *